(12) United States Patent
Sekiya

(10) Patent No.: US 12,011,784 B2
(45) Date of Patent: Jun. 18, 2024

(54) WAFER, WAFER MANUFACTURING METHOD, DEVICE CHIP MANUFACTURING METHOD, AND RESISTIVITY MARKINGS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 375 days.

(21) Appl. No.: 17/382,921

(22) Filed: Jul. 22, 2021

(65) Prior Publication Data

US 2022/0032404 A1 Feb. 3, 2022

(30) Foreign Application Priority Data

Aug. 3, 2020 (JP) .................................. 2020-131713

(51) Int. Cl.
| | |
|---|---|
| B23K 26/53 | (2014.01) |
| B23K 26/40 | (2014.01) |
| B23K 103/00 | (2006.01) |
| H01L 21/78 | (2006.01) |

(52) U.S. Cl.
CPC .............. *B23K 26/53* (2015.10); *B23K 26/40* (2013.01); *H01L 21/78* (2013.01); *B23K 2103/56* (2018.08)

(58) Field of Classification Search
CPC .... B23K 26/53; B23K 26/40; B23K 2103/56; B23K 26/0006; B23K 26/03; H01L 2223/544; H01L 21/78; H01L 2223/54406; H01L 2223/54433; H01L 23/544; H01L 21/02008; H01L 21/0201; H01L 21/02013; H01L 21/02027
See application file for complete search history.

(56) References Cited

U.S. PATENT DOCUMENTS

| 5,956,596 A | * | 9/1999 | Jang | ................... | H01L 21/02043 |
| | | | | | 257/E23.179 |
| 6,303,899 B1 | * | 10/2001 | Johnson | ................ | H01L 23/544 |
| | | | | | 257/E23.179 |
| 2004/0089958 A1 | * | 5/2004 | Arai | ....................... | H01L 23/544 |
| | | | | | 257/E23.179 |

(Continued)

FOREIGN PATENT DOCUMENTS

| JP | | 62193241 A | | 8/1987 | | |
| JP | | H0750328 A | * | 2/1995 | ....... | H01L 2223/544 |
| JP | | 2001076981 A | * | 3/2001 | | |

(Continued)

OTHER PUBLICATIONS

Office Action issued in counterpart Japanese patent application No. 2020-131713, dated Mar. 19, 2024, 6 pages.

*Primary Examiner* — John P. Dulka
(74) *Attorney, Agent, or Firm* — Greer Burns & Crain Ltd.

(57) ABSTRACT

A wafer manufacturing method for manufacturing a wafer from an ingot includes forming a peeling layer within the ingot by positioning a condensing point at a depth corresponding to the thickness of the wafer to be produced, and irradiating the ingot with a first laser beam, forming a character, a number, or a mark representing information regarding resistivity in or on the ingot by positioning a condensing point in a region in which devices are not to be formed and irradiating the ingot with a second laser beam, and dividing the ingot with the peeling layer as a starting point.

7 Claims, 12 Drawing Sheets

(56) References Cited

U.S. PATENT DOCUMENTS

| | | | | |
|---|---|---|---|---|
| 2019/0039187 A1* | 2/2019 | Sekiya | ............... | B23K 26/53 |
| 2021/0197319 A1* | 7/2021 | Hirata | ............. | B23K 26/0006 |

FOREIGN PATENT DOCUMENTS

| | | | |
|---|---|---|---|
| JP | 2001076981 | A | 3/2001 |
| JP | 2009081190 | A | 4/2009 |
| JP | 2015154075 | A | 8/2015 |
| JP | 2016127186 | A | 7/2016 |
| JP | 2019033162 | A | 2/2019 |
| JP | 2020113664 | A | 7/2020 |
| WO | 2005098915 | A1 | 10/2005 |

* cited by examiner

WAFER, WAFER MANUFACTURING METHOD, DEVICE CHIP MANUFACTURING METHOD, AND RESISTIVITY MARKINGS

BACKGROUND OF THE INVENTION

Field of the Invention

The present invention relates to a disk-shaped wafer, a wafer manufacturing method of manufacturing the wafer from a cylindrical ingot, and a device chip manufacturing method of manufacturing device chips by dividing the wafer.

Description of the Related Art

When a plurality of devices are formed on the top surface of a disk-shaped wafer formed of a semiconductor material, and the wafer is divided into each device, device chips to be mounted in electronical equipment can be formed. The wafer on which the devices such as integrated circuits (ICs), large scale integration (LSI) circuits, or light emitting diodes (LEDs) are formed is formed by dividing a cylindrical ingot. A method of using a laser beam, for example, is known as a method of manufacturing the wafer by dividing the ingot (see Japanese Patent Laid-Open No. 2016-127186). In this method, a laser beam of a wavelength transmissible through a material constituting the ingot (wavelength passing through the ingot) is condensed at a predetermined depth position from the top surface of the ingot and is scanned along a predetermined separation plane. Then, a peeling layer including modified layers and cracks extending from the modified layers is formed within the ingot along the separation plane. Then, the wafer is formed by dividing the ingot with the peeling layer as a separation starting point.

In addition, the laser beam can be used also when the device chips are manufactured by dividing the wafer on which the plurality of devices are formed. When the wafer is to be divided, modified layers are formed along planned dividing lines set on the top surface of the wafer so as to demarcate the plurality of devices by condensing a laser beam of a wavelength passing through the wafer within the wafer along the planned dividing lines. Then, the wafer is divided with the modified layers as a division starting point.

Incidentally, there is a finding that the yield of the device chips (semiconductor elements) formed from the wafer manufactured from the ingot depends on the position of the wafer in the ingot. There is thus a demand to identify the position of the wafer within the ingot afterward. There is known a wafer whose top surface or undersurface is provided with an identification mark including information regarding the position in an ingot of the wafer cut out from the ingot (see Japanese Patent Laid-Open No. 2001-76981).

SUMMARY OF THE INVENTION

Irradiation conditions such as the energy of the laser beam at a time of forming the modified layers within the wafer may be adjusted in consideration of transmittance of the wavelength of the laser beam in the wafer. The transmittance is known to depend on the thickness, impurity concentration, and the like of the wafer (see PCT Patent Publication No. WO2005/098915, for example). A method which irradiates the wafer before processing with the laser beam and calculates the transmittance is known (see Japanese Patent Laid-Open No. 2019-33162, for example). However, it takes time and effort to measure the transmittance of the laser beam in each wafer when determining the irradiation conditions of the laser beam at a time of dividing the wafer into each device. This decreases the productivity of the device chips. In addition, when a plurality of wafers are subjected to laser processing one after another, a laser oscillator needs to be made to stand by while remaining in an operational state until measurement of the transmittance of the laser beam in a new wafer is completed. This is also a factor in promoting degradation of the laser oscillator.

It is accordingly an object of the present invention to provide a wafer, a wafer manufacturing method, and a device chip manufacturing method that make it possible to determine processing conditions of the wafer quickly without measuring the transmittance of a laser beam in the wafer.

In accordance with an aspect of the present invention, there is provided a wafer in which a character, a number, or a mark representing information regarding resistivity is formed.

Preferably, the character, the number, or the mark representing the information regarding the resistivity is formed inside.

In addition, according to another aspect of the present invention, there is provided a wafer manufacturing method for manufacturing a wafer from an ingot. The wafer manufacturing method includes a slicing step of producing a plurality of the wafers by slicing the ingot, a grinding step of grinding the wafer produced in the slicing step, into a predetermined thickness, a polishing step of polishing one or both of a top surface and an undersurface of the wafer ground in the grinding step, a resistivity measuring step of measuring resistivity of the wafer, and an information printing step of forming a character, a number, or a mark representing information regarding the resistivity on one or more of the top surface, the undersurface, and an inside of the wafer after the resistivity measuring step.

In addition, according to yet another aspect of the present invention, there is provided a wafer manufacturing method for manufacturing a wafer from an ingot. The wafer manufacturing method includes a planarizing step of planarizing an end surface of the ingot, a resistivity measuring step of measuring resistivity of the ingot at the planarized end surface, a peeling layer forming step of forming a peeling layer within the ingot by positioning a condensing point of a first laser beam having a wavelength transmissible through the ingot at a depth corresponding to a thickness of the wafer to be produced from the end surface, and irradiating the ingot with the first laser beam, an information printing step of forming a character, a number, or a mark representing information regarding the resistivity measured in the resistivity measuring step on one or both of the planarized end surface and an inside of the ingot by positioning a condensing point of a second laser beam in a region in which devices are not to be formed in the wafer to be produced, and irradiating the ingot with the second laser beam, and a wafer producing step of producing the wafer by dividing the ingot with the peeling layer as a starting point, and peeling off the produced wafer.

Preferably, the ingot is a single crystal SiC ingot having the end surface, an opposite end surface on a side opposite from the end surface, a c-axis extending from the end surface to the opposite end surface, and a c-plane orthogonal to the c-axis, the c-axis is inclined with respect to a normal to the end surface, the c-plane is inclined with respect to the end surface at an off angle, and in the peeling layer forming step, the peeling layer including a modified layer is formed by repeating a processing feed step of forming the modified layer in a linear shape by moving the ingot and the condensing point of the first laser beam relative to each other in a first direction orthogonal to a direction in which the off angle is formed and parallel with the end surface and an indexing feed step of moving the ingot and the condensing point relative to each other in a second direction parallel with the direction in which the off angle is formed and the end surface.

In addition, preferably, in the information printing step, the number representing the resistivity is formed as the information regarding the resistivity.

Further, according to another aspect of the present invention, there is provided a device chip manufacturing method for manufacturing a plurality of device chips by dividing a wafer by laser processing, a plurality of planned dividing lines intersecting each other being set on a top surface of the wafer, a device being formed in each of regions demarcated by the planned dividing lines on the top surface. The device chip manufacturing method includes a loading step of loading the wafer into a laser processing apparatus, a laser processing step of forming modified layers within the wafer along the planned dividing lines by positioning a condensing point of a laser beam having a wavelength passing through the wafer within the wafer, and applying the laser beam to the condensing point while moving the condensing point and the wafer relative to each other in a direction parallel with the top surface, and a dividing step of manufacturing a plurality of the device chips by dividing the wafer with the modified layers as a starting point. A character, a number, or a mark representing information regarding resistivity of the wafer is formed in or on the wafer. In the laser processing step, the wafer is irradiated with the laser beam under an irradiation condition determined on the basis of the resistivity of the wafer, the resistivity being able to be obtained from the character, the number, or the mark representing the information regarding the resistivity of the wafer.

The transmittance of light of a specific wavelength in a wafer is known to depend on impurity concentration or the like of the wafer. In addition, the resistivity of the wafer is known to be determined by the impurity concentration of the wafer. That is, the irradiation conditions of the laser beam to be applied to the wafer can be determined on the basis of the resistivity of the wafer. In the wafer according to one aspect of the present invention, the wafer manufacturing method, and the device chip manufacturing method, a character, a number, or a mark representing information regarding the resistivity of the wafer is formed in or on the wafer. For example, when the wafer is cut out from an ingot, the resistivity of the ingot (wafer) is measured, and dividing conditions of the ingot are determined on the basis of a measured value of the resistivity. At this time, a number representing the obtained measured value is printed within the wafer.

In this case, when a modified layer or the like serving as a division starting point is to be thereafter formed within the wafer by irradiating the wafer with a laser beam, the resistivity of the wafer can be obtained by reading the character, the number, or the mark representing the information regarding the resistivity of the wafer, the character, the number, or the mark being formed in or on the wafer. Therefore, when the irradiation conditions of the laser beam are to be determined, the resistivity of the wafer does not need to be measured again, so that the irradiation conditions can be determined quickly.

Hence, the present invention provides a wafer, a wafer manufacturing method, and a device chip manufacturing method that make it possible to determine the processing conditions of a wafer quickly without measuring the transmittance of a laser beam in the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
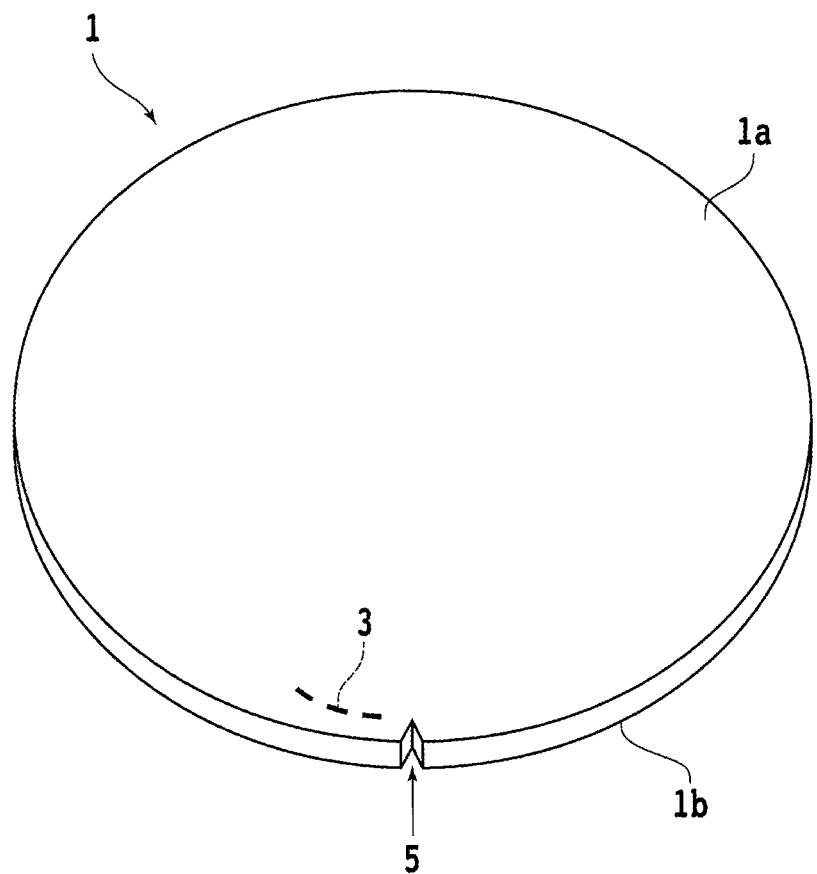
FIG. 1A is a perspective view schematically depicting a wafer.
Figure 1B:
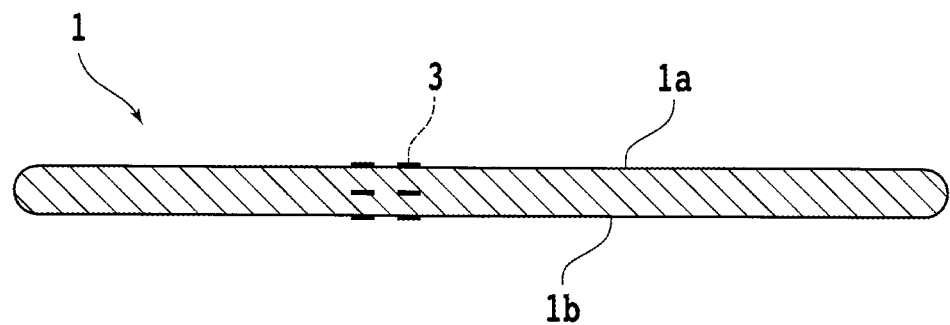
FIG. 1B is a sectional view schematically depicting the wafer.

Embodiments of the present invention will be described with reference to the accompanying drawings. A wafer according to the present embodiment will first be described. FIG. 1A is a perspective view schematically depicting a wafer 1 according to the present embodiment. FIG. 1B is a sectional view schematically depicting the wafer 1 according to the present embodiment. The wafer 1 is, for example, a disk-shaped substrate formed of silicon (Si), silicon carbide (SiC), gallium nitride (GaN), or another semiconductor material. Alternatively, the wafer 1 is formed of a double oxide such as lithium tantalate (LT) and lithium niobate (LN) or a material such as sapphire ($Al_2O_3$). A plurality of planned dividing lines intersecting each other are set on a top surface 1a of the wafer 1. A device such as an IC, LSI, or an LED is formed in each of regions demarcated by the planned dividing lines. Then, individual device chips can be formed when the wafer is divided along the planned dividing lines. In a case where the wafer 1 is a SiC wafer, for example, the wafer 1 is used to manufacture a power device or the like typified by an inverter or a converter.

A character, a number, or a mark 3 representing information regarding resistivity is formed on the top surface 1*a*, an undersurface 1*b*, or an inside of the wafer 1 according to the present embodiment. The character, the number, or the mark 3 representing the information regarding the resistivity is, for example, referred to when processing conditions such as irradiation conditions of a laser beam or the like at a time of dividing the wafer 1 by irradiating the wafer 1 with the laser beam are determined. Even in a case where the character, the number, or the mark 3 is formed within the wafer 1, the character, the number, or the mark 3 can be read when the wafer 1 is transparent. In addition, even in a case where the wafer 1 is opaque, the character, the number, or the mark 3 can be read by using light of a wavelength passing through the wafer 1. When the character, the number, or the mark 3 is formed within the wafer 1, the character, the number, or the mark 3 is not easily lost even when the wafer 1 is processed. In the following, the wafer 1 will be further described by describing a process of manufacturing the wafer 1 on or in which the character, the number, or the mark 3 representing the information regarding the resistivity is formed and a process of manufacturing device chips with use of the wafer 1.

Figure 2:
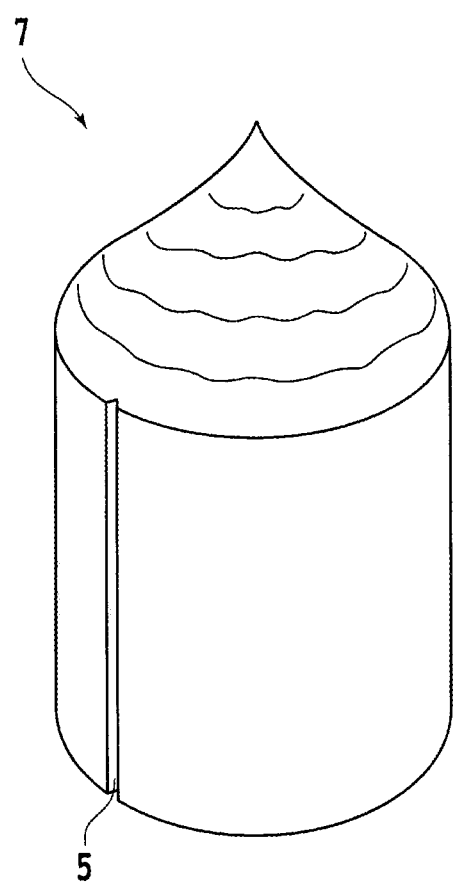
FIG. 2 is a perspective view schematically depicting an ingot.

FIG. 2 is a perspective view schematically depicting an ingot 7 as a raw material for the wafer 1. The ingot 7 is, for example, formed by a Czochralski method that brings a seed crystal into contact with a molten member and pulls up the seed crystal. In a case where a single crystal ingot formed of a semiconductor material such as silicon is to be manufactured, for example, boron or phosphorus may be mixed as a dopant in the molten member. However, the method of manufacturing the ingot 7 is not limited to this. In a case where the ingot 7 is a single crystal ingot, the crystal orientation of the ingot 7 is measured, and a notch portion referred to as a notch 5 or an orientation flat indicating the crystal orientation is formed on the ingot 7. In this case, the notch 5 or the like remains also on the wafer 1 cut out from the ingot 7. Thus, the crystal orientation of the wafer 1 can be identified by referring to the notch 5 or the like.

Figure 12A:
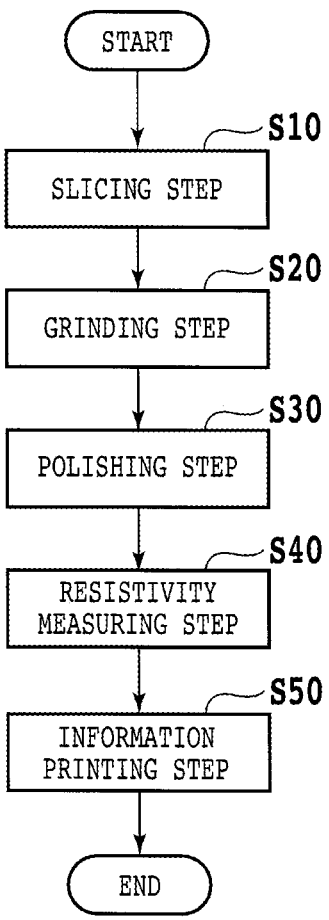
FIG. 12A is a flowchart depicting a flow of steps of an example of a wafer manufacturing method.

Description will next be made of a method of manufacturing the wafer 1 according to the present embodiment, which method manufactures the wafer 1 from the ingot 7. FIG. 12A is a flowchart of assistance in explaining a flow of steps of the method of manufacturing the wafer 1 according to the present embodiment. In the method of manufacturing the wafer 1 according to the present embodiment, a slicing step S10 in which a plurality of wafers 1 is produced by slicing the ingot 7 is performed first. In the slicing step S10, the ingot 7 is cut by using a wire saw (not depicted) having a wire-shaped saw blade, for example. The wafer 1 is cut out when the cylindrical ingot 7 is cut by the wire saw along a plane perpendicular to the extending direction of the cylindrical ingot 7 at a predetermined interval.

Figure 3:
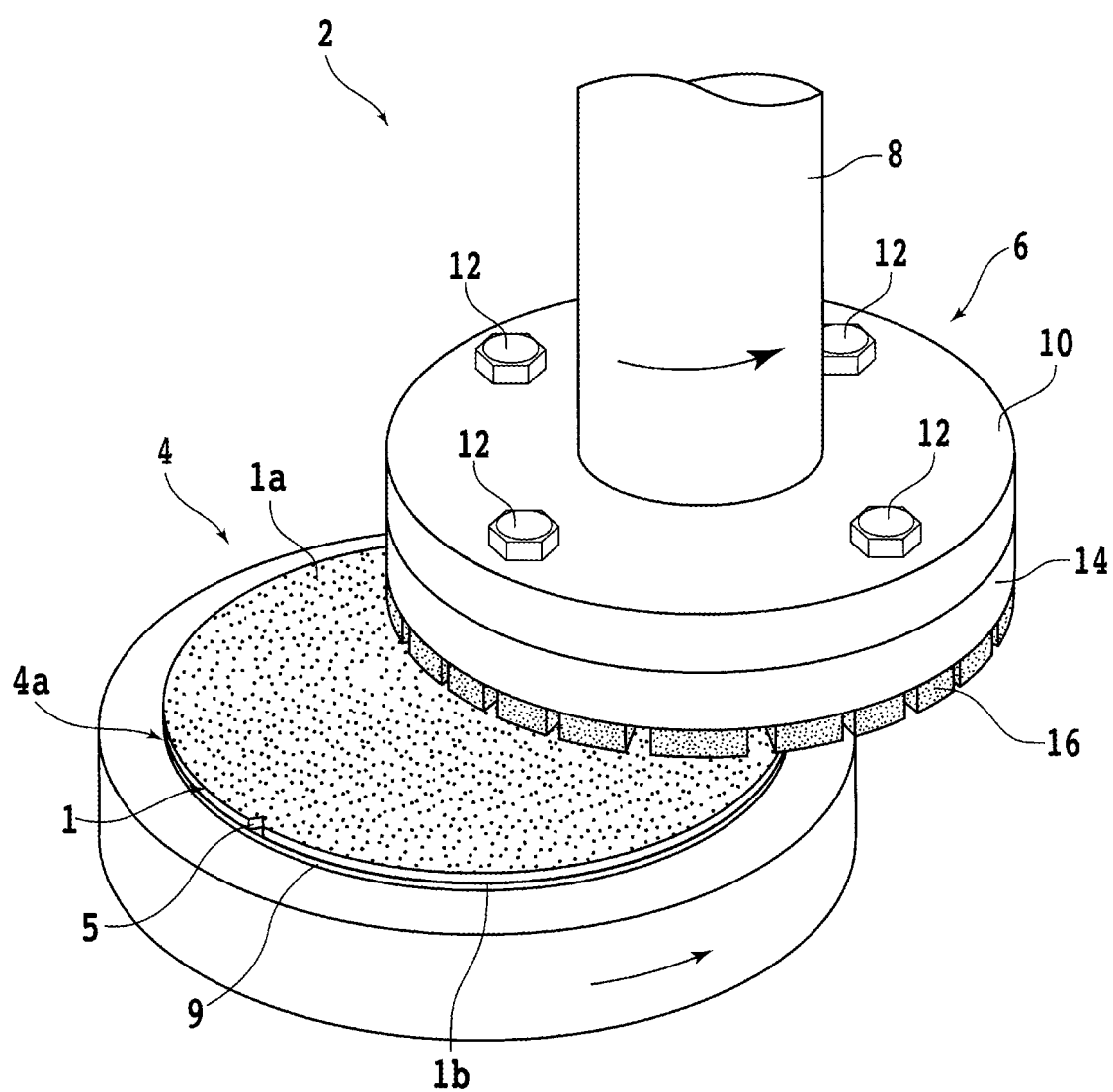
FIG. 3 is a perspective view schematically depicting a grinding step.

Here, a processing distortion layer caused by the wire saw is formed on the top surface 1*a* and the undersurface 1*b* of the wafer 1 that have just been cut out by the wire saw. Accordingly, the top surface 1*a* and the undersurface 1*b* of the wafer 1 are ground and thinned to a predetermined thickness, and thereafter the top surface 1*a* and the undersurface 1*b* of the wafer 1 are polished and finished into a flat surface to a degree that the surfaces can be said to be a mirror surface. Then, the wafer 1 of a predetermined thickness in a state suitable for forming devices is obtained. That is, a grinding step S20 of grinding the wafer 1 produced in the slicing step S10 into a predetermined thickness and a polishing step S30 of polishing the ground wafer 1 are performed after the slicing step S10 is performed. FIG. 3 is a perspective view schematically depicting the grinding step S20.

In the grinding step S20, a grinding apparatus 2 is used. The grinding apparatus 2 includes a chuck table 4 that sucks and holds the wafer 1 as a workpiece; and a grinding unit 6 that grinds the workpiece held on the chuck table 4. The chuck table 4 has, as an upper surface thereof, a porous member (not depicted) having a diameter equal to that of the wafer 1. The upper surface becomes a holding surface 4*a* on which the wafer 1 is mounted. The porous member is connected to a suction source not depicted. The chuck table 4 can suck and hold the wafer 1 mounted on the holding surface 4*a*. The grinding unit 6 includes a spindle 8 along a direction substantially perpendicular to the holding surface 4*a* and a rotational driving source (not depicted) such as a motor connected to an upper end of the spindle 8. A lower end of the spindle 8 is provided with a disk-shaped wheel mount 10 having a diameter similar to that of the wafer 1. An annular grinding wheel 14 is fixed to a lower surface of the wheel mount 10 by fixtures 12 such as bolts. A lower surface of the grinding wheel 14 is fitted with grinding stones 16 arranged annularly. The grinding stones 16 include abrasive grains such as diamond and a binding material that disperses and fixes the abrasive grains.

In the grinding step S20, first, the wafer 1 is placed on the holding surface 4*a* of the chuck table 4. Then, the suction source is actuated, and the chuck table 4 thereby sucks and holds the wafer 1. At this time, a grinding target surface of the wafer 1 is exposed upward, and a surface of the wafer 1 which surface is on an opposite side is faced to the holding surface 4*a*. In addition, in order to protect a non-ground surface of the wafer 1 to be ground at this time, a protective member 9 may be affixed to the surface in advance. Then, the chuck table 4 is rotated about an axis substantially perpendicular to the holding surface 4*a*, and the spindle 8 is rotated. Thereafter, the chuck table 4 and the grinding unit 6 are moved relative to each other so as to approach each other, and the grinding stones 16 moving in an annular orbit are brought into contact with the grinding target surface of the wafer 1. Then, the wafer 1 is ground and thinned. After completion of the grinding of one surface of the wafer 1, the other surface of the wafer 1 is similarly ground. The grinding of both surfaces of the wafer 1 is thereby completed. Then, the processing distortion layers formed on the top surface 1*a* and the undersurface 1*b* of the wafer 1 due to the cutting of the ingot 7 by the wire saw are thinned, and the wafer 1 is thinned to a predetermined thickness.

Figure 4:
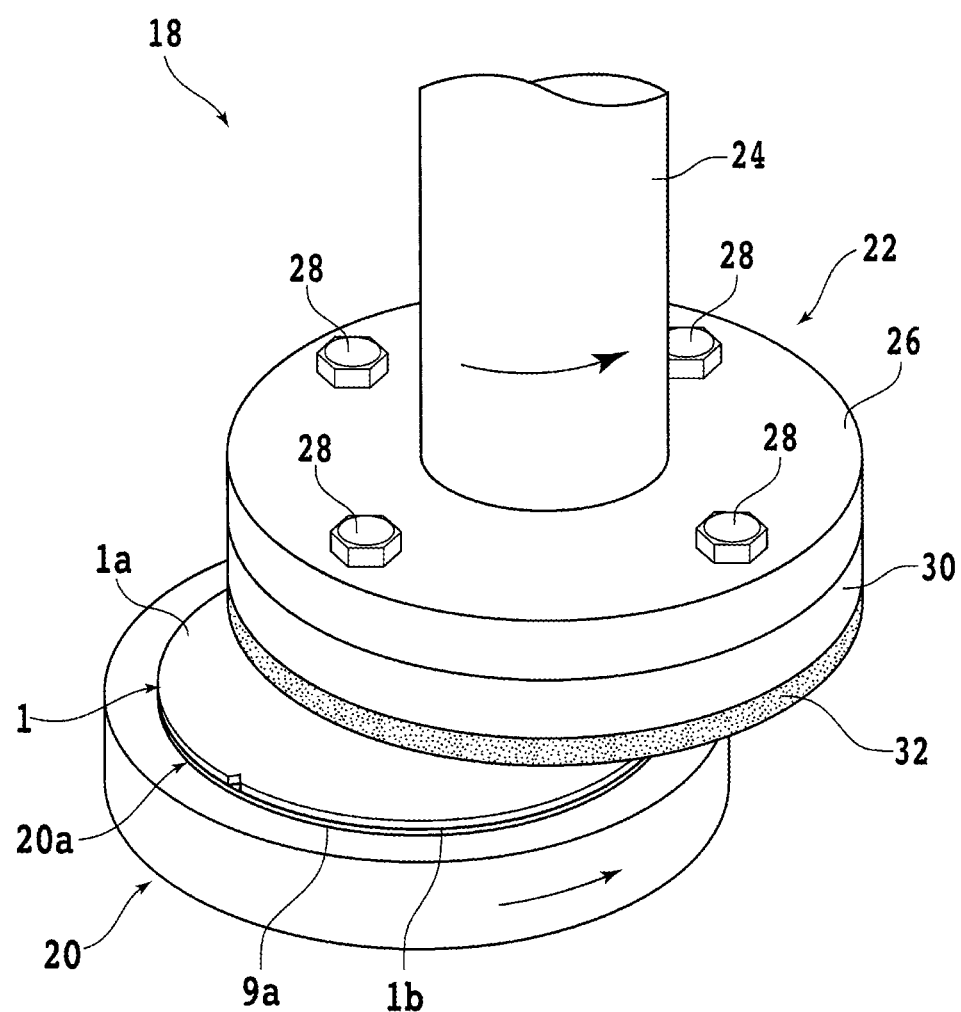
FIG. 4 is a perspective view schematically depicting a polishing step.

After the grinding step S20 is performed, the polishing step S30 is performed to polish one or both of the top surface 1*a* and the undersurface 1*b* of the wafer 1 ground in the grinding step S20. FIG. 4 is a perspective view schematically depicting the polishing step S30. In the polishing step S30, a polishing apparatus 18 is used. The polishing apparatus 18 is configured in a manner similar to that of the grinding apparatus 2. The polishing apparatus 18 includes a chuck table 20 that sucks and holds the wafer 1 and a polishing unit 22 that polishes the wafer 1. The upper surface of the chuck table 4 becomes a holding surface 20*a*. The polishing unit 22 includes a spindle 24 and a rotational driving source (not depicted) such as a motor connected to an upper end of the spindle 24. A lower end of the spindle 24 is provided with a wheel mount 26. A polishing wheel 30 is fixed to a lower surface of the wheel mount 26 by fixtures 28. A polishing pad 32 is fixed to a lower surface of the polishing wheel 30.

In the polishing step S30, as in the grinding step S20, the polishing pad 32 is brought into contact with a polishing target surface of the wafer 1 while the chuck table 20 and the spindle 24 are rotated. Incidentally, in the polishing step S30, a protective member 9a may be affixed to a surface of the wafer 1 which surface is on a side opposite from the polishing target surface in advance. In the polishing step S30, it is preferable to polish at least one of the top surface 1a and the undersurface 1b of the wafer 1 on which surface devices are to be formed, and it is more preferable to polish both surfaces. When the polishing step S30 is performed, the processing distortion layer formed on the polishing target surface is removed, and the wafer 1 is processed into a mirror surface.

The wafer manufacturing method according to the present embodiment further performs a resistivity measuring step S40 of measuring resistivity of the wafer 1 and an information printing step S50 of forming the character, the number, or the mark 3 representing information regarding the measured resistivity. The resistivity measuring step S40 and the information printing step S50 are performed after the slicing step S10 is performed. For example, the resistivity measuring step S40 and the information printing step S50 are preferably performed before the grinding step S20 or after the polishing step S30. In the resistivity measuring step S40, the resistivity of the wafer 1 is measured by a known method. For example, the resistivity of the wafer 1 can be measured by using a EC-80C™ resistance measuring instrument manufactured by NAPSON CORPORATION, the resistance measuring instrument measuring the resistivity of the wafer 1 by an eddy current method. Alternatively, the resistivity of the wafer 1 may be measured by a contact type resistance measuring instrument using a four-terminal method or the like. A method of measuring the resistivity of the wafer 1 is not particularly limited. However, damage to the wafer 1 or the like does not easily occur when a noncontact type resistance measuring instrument is used, and therefore the use of a noncontact type resistance measuring instrument is preferable.

Figure 5:
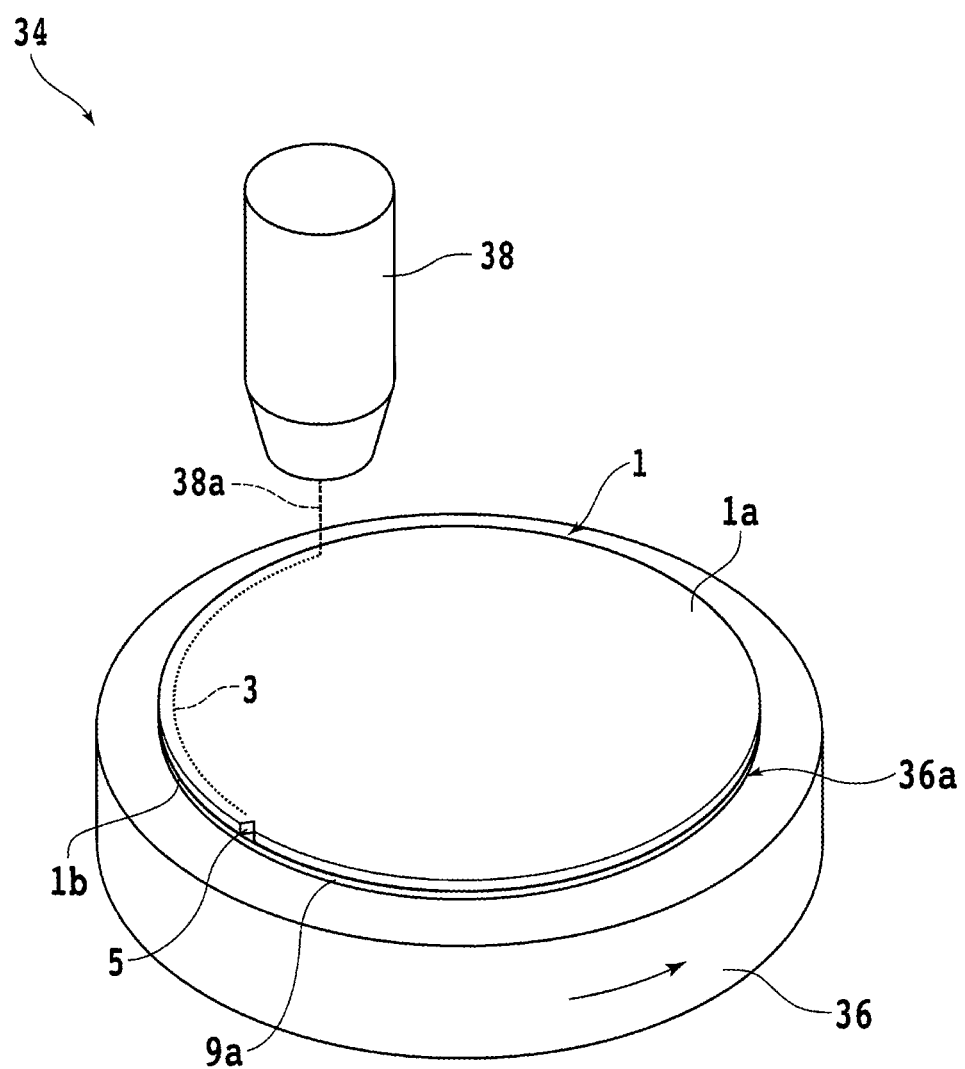
FIG. 5 is a perspective view schematically depicting an example of an information printing step.

In the information printing step S50, the character, the number, or the mark 3 representing the information regarding the resistivity of the wafer 1 which resistivity is measured and obtained in the resistivity measuring step S40 is formed in the wafer 1. FIG. 5 is a perspective view schematically depicting an example of the information printing step S50. The information printing step S50 is, for example, performed in a laser processing apparatus 34. The laser processing apparatus 34 includes a chuck table 36 whose upper surface becomes a holding surface 36a that sucks and holds the wafer 1; and a laser processing unit 38 that subjects the wafer 1 held on the chuck table 36 to laser processing by irradiating the wafer 1 with a laser beam. The chuck table 36 is configured in a manner similar to that of the chuck table 4 of the grinding apparatus 2. The laser processing unit 38 includes a laser oscillator (not depicted) that emits the laser beam and a condensing lens (not depicted) that condenses the laser beam emitted by the laser oscillator.

The laser processing unit 38 can, for example, condense a laser beam 38a of a wavelength passing through the wafer 1 at a predetermined height position within the wafer 1, and thereby form a modified layer in the vicinity of a condensing point. In a case where the wafer 1 is a SiC wafer, for example, the laser beam 38a is applied under the following conditions so as to be condensed at a height position approximately 100 μm below the top surface 1a.

Wavelength: 1064 nm
Repetition frequency: 140 kHz
Average power: 1.0 W

The chuck table 36 and the laser processing unit 38 can be moved relative to each other in a direction parallel with the holding surface 36a. When the chuck table 36 and the laser processing unit 38 are moved relative to each other while the wafer 1 is irradiated with the laser beam 38a, the position of the condensing point can be controlled, and a modified layer can be formed at a desired position. Then, the information printing step S50, for example, forms a modified layer having a predetermined planar shape within the wafer 1, and thereby forms the character, the number, or the mark 3 representing the information regarding the resistivity of the wafer 1.

Incidentally, the character, the number, or the mark 3 representing the information regarding the resistivity of the wafer 1 may be formed on the top surface 1a or the undersurface 1b rather than within the wafer 1. In this case, for example, the laser processing apparatus 34 condenses the laser beam 38a of a wavelength absorbed by the wafer 1 on the top surface 1a or the undersurface 1b of the wafer 1 and forms a processing trace on the top surface 1a or the undersurface 1b of the wafer 1 by ablation. That is, the character, the number, or the mark 3 is impressed on the top surface 1a or the undersurface 1b by forming a processing trace of a predetermined shape. Here, the character, the number, or the mark 3 representing the information regarding the resistivity is, for example, a combination of a number representing a measured value itself of the resistivity of the wafer 1, the measured value being obtained in the resistivity measuring step S40, and characters representing the unit of the measured value. Alternatively, the character, the number, or the mark 3 representing the information regarding the resistivity is a character or the like indicating a class to which the resistivity belongs when resistivity is classified into a plurality of predetermined classes. Alternatively, the character, the number, or the mark 3 representing the information regarding the resistivity may be a symbol such as a bar code or a two-dimensional code storing information regarding the measured value of the resistivity or the class to which the resistivity belongs.

As described above, the wafer manufacturing method according to the present embodiment can manufacture the wafer 1 in which the character, the number, or the mark 3 representing the information regarding the resistivity is formed on at least one of the top surface 1a, the undersurface 1b, and the inside. A plurality of devices are thereafter formed on the top surface 1a of the manufactured wafer 1. When the wafer 1 is thereafter divided into each device, individual device chips are obtained. The character, the number, or the mark 3 representing the information regarding the resistivity, the character, the number, or the mark 3 being formed on or in the wafer 1, is read when the wafer 1 is to be divided, and is referred to when processing conditions such as irradiation conditions of the laser beam at a time of dividing the wafer 1 are determined.

Figure 6:
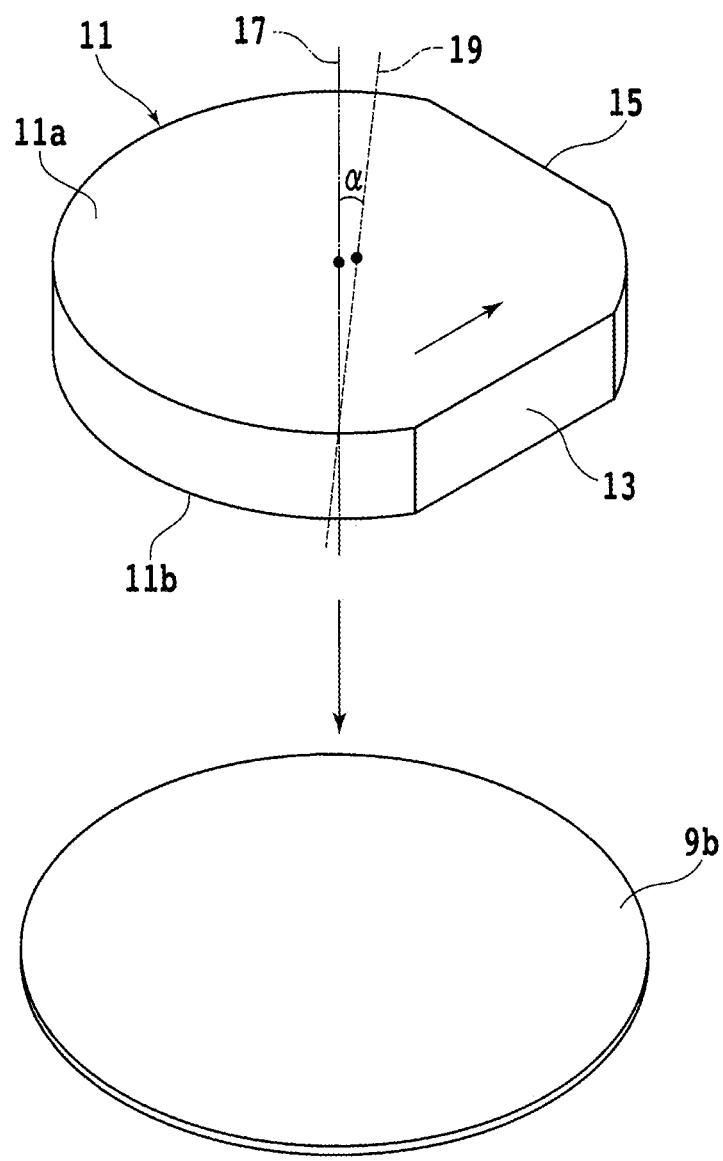
FIG. 6 is a perspective view schematically depicting a process of affixing a protective member to an ingot.
Figure 8A:
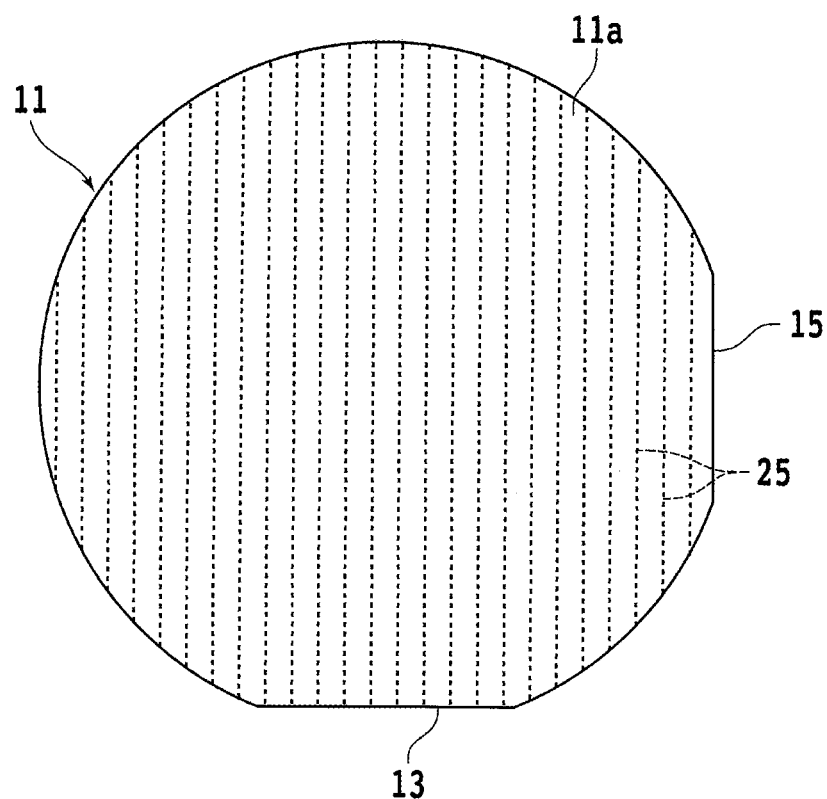
FIG. 8A is a plan view schematically depicting the ingot having a peeling layer formed therein.
Figure 8B:
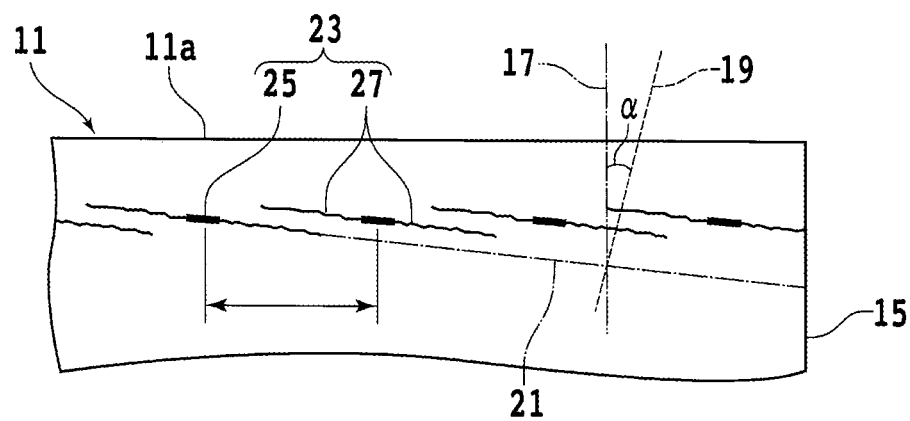
FIG. 8B is a sectional view schematically depicting the ingot having the peeling layer formed therein.

Incidentally, the wafer 1 may be manufactured by being cut out from an ingot by another method. A wafer manufacturing method according to another embodiment will next be described. The wafer manufacturing method according to the other embodiment manufactures the wafer 1 by setting a separation plane at a predetermined depth within a cylindrical ingot 11, forming a modified layer as a peeling layer along the separation plane, and dividing the ingot 11 by the peeling layer. FIG. 6 includes a perspective view schematically depicting the ingot 11. FIG. 8B is a sectional view schematically depicting, in enlarged dimension, the ingot 11 in which modified layers 25 and cracks 27 constituting a peeling layer 23 are formed. The ingot 11 has a top surface 11a and an undersurface 11b on a side opposite from the top surface 11a. The top surface 11a and the undersurface 11b are parallel with each other.

In a case where the ingot 11 is a single crystal SiC ingot, for example, a first orientation flat 13 and a second orientation flat 15 orthogonal to the first orientation flat 13 are formed, as depicted in FIG. 6. The length of the first orientation flat 13 is formed so as to be longer than the length of the second orientation flat 15.

The ingot 11 as a single crystal SiC ingot has a c-axis 19 inclined with respect to a normal 17 to an end surface (top surface 11a) by an off angle α in the direction of the second orientation flat 15 and a c-plane 21 orthogonal to the c-axis 19. The c-axis 19, for example, extends from the end surface (top surface 11a) to an opposite end surface (undersurface 11b) on a side opposite from the end surface (top surface 11a). The c-plane 21 is inclined with respect to the top surface 11a of the ingot 11 by the off angle α. In general, in the SiC ingot, a direction orthogonal to the extending direction of the short second orientation flat 15 is the inclination direction of the c-axis 19. An infinite number of c-planes 21 are set on a molecular level in the SiC ingot. The off angle α is, for example, set at 4°. However, the off angle α is not limited to 4°. For example, the SiC ingot can be manufactured with the off angle α freely set in a range of 1° to 6°. However, the ingot 11 is not limited to the SiC ingot.

Figure 12B:
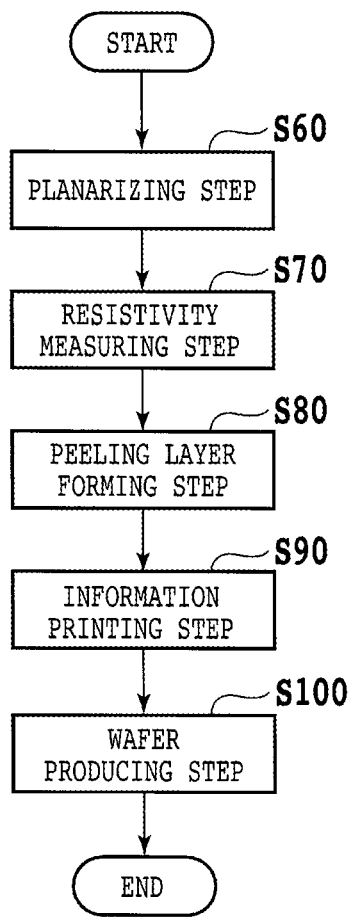
FIG. 12B is a flowchart depicting a flow of steps of another example of the wafer manufacturing method.

Description will be made of each step of the wafer manufacturing method according to the other embodiment. FIG. 12B is a flowchart of assistance in explaining a flow of steps of the wafer manufacturing method according to the other embodiment. The wafer manufacturing method first performs a planarizing step S60 of planarizing an end surface (the top surface 11a or the undersurface 11b) of the ingot 11. Incidentally, as depicted in FIG. 6, a protective member 9b may be affixed to the surface of the ingot 11 which surface is on a side opposite from the end surface to be polished before the planarizing step S60 is performed. The planarizing step S60 polishes and planarizes the end surface of the ingot 11 as a laser beam irradiation surface, as will be described later. When the end surface is planarized, the laser beam enters the inside of the ingot 11 from the end surface in an orderly manner, and therefore, the laser beam can be appropriately condensed at a predetermined position. The planarizing step S60 polishes the end surface of the ingot 11 by using the polishing apparatus 18 described with reference to FIG. 4, for example.

Figure 7A:
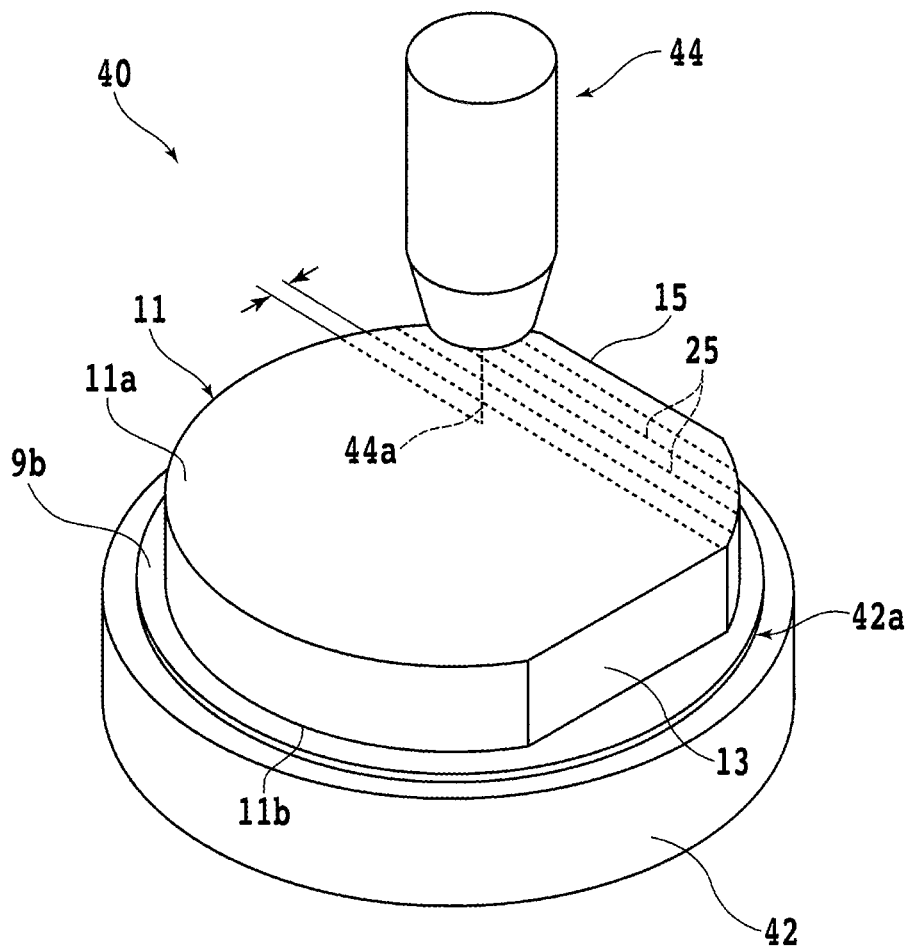
FIG. 7A is a perspective view schematically depicting a peeling layer forming step.
Figure 7B:
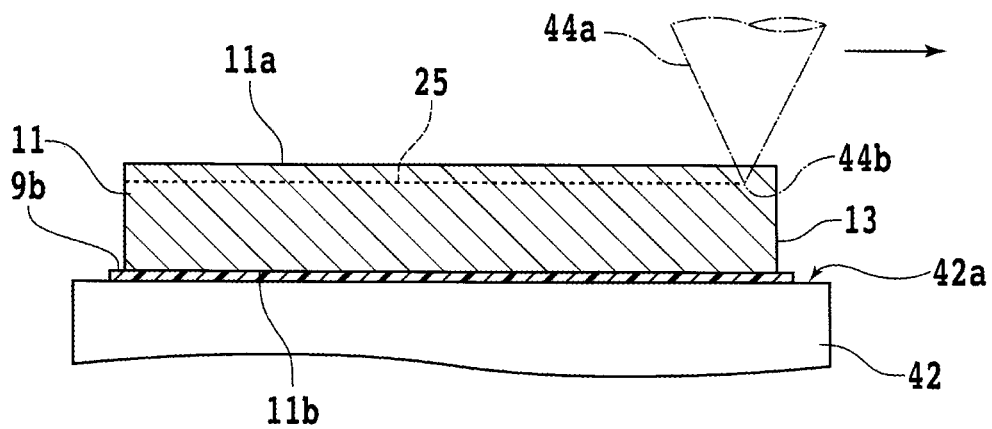
FIG. 7B is a sectional view schematically depicting the ingot being subjected to laser processing.

Then, after the planarizing step S60 is performed, a resistivity measuring step S70 which measures the resistivity of the ingot 11 on the planarized end surface is performed. Incidentally, the resistivity measuring step S70 is performed in a manner similar to that of the above-described resistivity measuring step S40. A peeling layer forming step S80 is performed next. FIG. 7A is a perspective view schematically depicting the peeling layer forming step S80. FIG. 7B is a sectional view schematically depicting the ingot 11 in a process in which the modified layers 25 constituting the peeling layer 23 are being formed in the peeling layer forming step S80. FIG. 8A is a plan view schematically depicting the ingot 11 in which the modified layers 25 are formed. FIG. 8B is a sectional view schematically depicting, in enlarged dimension, the ingot 11 in which the modified layers 25 and the cracks 27 constituting the peeling layer 23 are formed. Incidentally, in the sectional view depicted in FIG. 8B, hatching to be added is omitted.

The peeling layer forming step S80 is performed by a laser processing apparatus 40 configured in a manner similar to that of the laser processing apparatus 34 described with reference to FIG. 5. The laser processing apparatus 40 includes a chuck table 42 whose upper surface becomes a holding surface 42a and a laser processing unit 44 that can subject the wafer 1 held on the chuck table 42 to laser processing.

In the peeling layer forming step S80, first, the ingot 11 is mounted on the chuck table 42 of the laser processing apparatus 40, and the chuck table 42 is made to suck and hold the ingot 11 by actuating a suction holding mechanism of the chuck table 42. Next, the laser processing unit 44 is moved to a position above the ingot 11, and a condensing point 44b of a first laser beam 44a emitted from the laser processing unit 44 is positioned at a predetermined height position by adjusting an optical system of the laser processing unit 44 or adjusting the height of the laser processing unit 44. Here, the predetermined height at which the condensing point 44b of the first laser beam 44a is positioned is the height position of the separation plane set at a predetermined depth from the top surface 11a of the ingot 11 in advance. The separation plane is a plane set within the ingot 11 so as to be parallel with the top surface 11a and is a plane where the division of the ingot 11 is planned. The separation plane is a plane separated from the top surface 11a of the ingot 11 at a depth corresponding to the thickness of the wafer 1 to be manufactured from the ingot 11.

In the peeling layer forming step S80, the condensing point 44b of the first laser beam 44a having a wavelength transmissible through the ingot 11 is positioned at the separation plane. Then, the ingot 11 is irradiated with the first laser beam 44a from the top surface 11a side while the condensing point 44b and the chuck table 42 are moved relative to each other along the separation plane. More specifically, the peeling layer forming step S80 repeats a processing feed step S81 of forming a linear modified layer 25 by moving the ingot 11 and the condensing point 44b relative to each other in a first direction and an indexing feed step S82 of moving the ingot 11 and the condensing point 44b relative to each other in a second direction. Here, the first direction is a direction orthogonal to the direction in which the off angle α is formed, is a direction parallel with the end surface (top surface 11a), and is a direction parallel with the second orientation flat 15. In addition, the second direction is the direction in which the off angle α is formed, is a direction parallel with the end surface (top surface 11a), and is a direction parallel with the first orientation flat 13.

When the first laser beam 44a is condensed within the ingot 11, a modified layer 25 is formed in the vicinity of the condensing point 44b. Further, cracks 27 extend from the formed modified layer 25. For example, in a case where the ingot 11 is a SiC ingot, the cracks 27 tend to extend easily along the c-plane 21 (see FIG. 8B and the like) of the ingot 11 when the modified layer 25 is formed along the second orientation flat 15. Then, when a plurality of linear modified layers 25 are formed along the separation plane and cracks 27 are extended from each of the modified layers 25, the modified layers 25 or the cracks 27 are formed over the entire region of the separation plane. Incidentally, in FIG. 7A, FIG. 7B, and FIG. 8A, for the convenience of description, the modified layers 25 formed within the ingot 11 are indicated by broken lines, and the cracks 27 are omitted. When the modified layers 25 and the cracks 27 are formed along the separation plane, the ingot 11 is divided easily with the modified layers 25 and the cracks 27 as a starting point. That is, the modified layers 25 and the cracks 27 function as the peeling layer 23. In the peeling layer forming step S80, the peeling layer 23 including the modified layers 25 and the cracks 27 extending from the modified layers 25 is formed along the separation plane within the ingot 11.

Here, the irradiation conditions of the first laser beam 44a will be described. When the ingot 11 is irradiated with the first laser beam 44a of a wavelength passing through the ingot 11, the irradiation conditions need to be adjusted according to transmittance of light of the wavelength in the ingot 11 in order to make the first laser beam 44a reach the condensing point 44b under appropriate conditions. Further, the transmittance of light in the ingot 11 depends on the concentration of impurities included in the ingot 11. In addition, the resistivity of the ingot 11 changes according to the concentration of the impurities included in the ingot 11. Therefore, the resistivity of the ingot 11 is measured, and the irradiation conditions of the first laser beam 44a can be determined on the basis of the resistivity. Accordingly, in the peeling layer forming step S80, the irradiation conditions of the first laser beam 44a are preferably determined on the basis of the resistivity of the ingot 11 which resistivity is measured in the resistivity measuring step S70.

For example, in a case where the ingot 11 is a SiC ingot, the ingot 11 can be said to be a low-resistance product when the resistivity of the ingot 11 which resistivity is measured in the resistivity measuring step S70 is equal to or less than 100 mΩ·cm. In particular, in a case where the ingot 11 is a low-resistance product having a resistivity of 16 mΩ·cm to 22 mΩ·cm both inclusive, the ingot 11 is preferably irradiated with the first laser beam 44a under the following irradiation conditions.

Wavelength: 1064 nm
Repetition frequency: 30 kHz
Average power: 5.4 W
Condensing depth: 300 μm In addition, in a case where the ingot 11 as a SiC ingot cannot be said to be a low-resistance product as a result of measurement in the resistivity measuring step S70, for example, the ingot 11 is preferably irradiated with the first laser beam 44a under the following irradiation conditions.

Wavelength: 1064 nm
Repetition frequency: 80 kHz
Average power: 3.2 W
Condensing depth: 300 μm Thus, the peeling layer forming step S80 can form the peeling layer 23 within the ingot 11 appropriately by adjusting the irradiation conditions of the first laser beam 44a according to the resistivity of the ingot 11. Incidentally, the conditions to be adjusted on the basis of the resistivity of the ingot 11 are not limited to the above, and other conditions may be adjusted.

Figure 9:
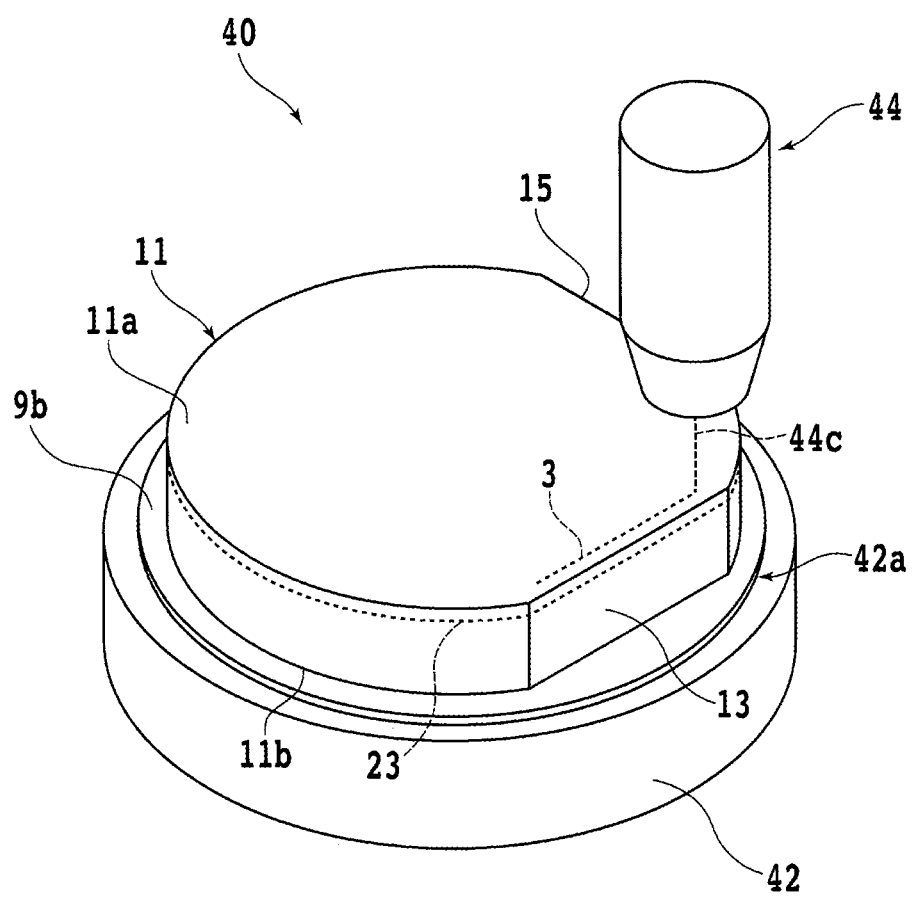
FIG. 9 is a perspective view schematically depicting another example of the information printing step.

An information printing step S90 will next be described. The information printing step S90 can be performed in a manner similar to that of the information printing step S50 described above, and therefore the description of the information printing step S50 can be referred to as appropriate. FIG. 9 is a perspective view schematically depicting the information printing step S90. The information printing step S90 may, for example, be performed following the peeling layer forming step S80 in the laser processing apparatus 40 that has performed the peeling layer forming step S80. In the information printing step S90, the character, the number, or the mark 3 representing the information regarding the resistivity of the ingot 11 which resistivity is measured in the resistivity measuring step S70 is formed in a region in which devices are not to be thereafter formed in the wafer 1 produced by being peeled off from the ingot 11 at the peeling layer 23. The character, the number, or the mark 3 is, for example, formed in an edge portion of the ingot 11.

Here, in the information printing step S90, the character, the number, or the mark 3 is formed on one or both of the planarized end surface (top surface 11a) and the inside of the ingot 11 by a second laser beam 44c emitted from the laser processing unit 44. For example, it is preferable to form a modified layer by condensing the second laser beam 44c of a wavelength passing through the ingot 11 at a height position shallower than the peeling layer 23 within the ingot 11, and thereby form the character, the number, or the mark 3 constituted by the modified layer. In this case, the wavelength of the second laser beam 44c is preferably a wavelength passing through the ingot 11, and the ingot 11 is preferably irradiated with the second laser beam 44c under the following irradiation conditions.

Wavelength: 1064 nm
Repetition frequency: 140 kHz
Average power: 1.0 W
Condensing depth: 100 μm In addition, in a case where the character, the number, or the mark 3 is formed on the top surface 11a of the ingot 11, it is preferable to condense the second laser beam 44c of a wavelength absorbed by the ingot 11 on the top surface 11a of the ingot 11, and form the character, the number, or the mark 3 by ablation processing.

Incidentally, the information printing step S90 may be performed before the peeling layer forming step S80 or performed after the peeling layer forming step S80. However, when the information printing step S90 is performed after the peeling layer forming step S80, the character, the number, or the mark 3 formed in or on the ingot 11 does not interfere with the formation of the peeling layer 23.

After the information printing step S90 is performed, a wafer producing step S100 which produces the wafer 1 by dividing the ingot 11 with the peeling layer 23 as a starting point and peeling off the formed wafer 1 is performed. The wafer producing step S100, for example, divides the ingot 11 by applying ultrasonic vibration to the ingot 11 having the peeling layer 23 formed therewithin. However, the method of peeling off the wafer 1 is not limited to this. When the ingot 11 is divided, the wafer 1 which has the character, the number, or the mark 3 formed within the wafer 1 or on the top surface of the wafer 1 is obtained, the character, the number, or the mark 3 representing the information regarding the resistivity. As described above, the method of manufacturing the wafer 1 as described with reference to the flowchart of FIG. 12B manufactures the wafer 1 having the character, the number, or the mark 3 formed within the wafer 1 or on the top surface of the wafer 1, the character, the number, or the mark 3 representing the information regarding the resistivity.

Figure 12C:
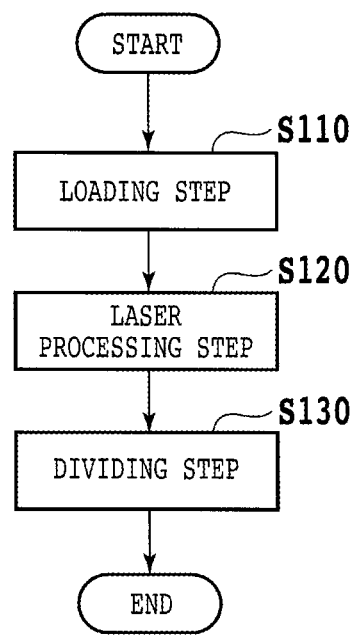
FIG. 12C is a flowchart depicting a flow of steps of a device chip manufacturing method.

Description will next be made of a device chip manufacturing method that divides the wafer 1 having the character, the number, or the mark 3 formed therein or thereon, the character, the number, or the mark 3 representing the information regarding the resistivity, and further having a plurality of devices formed on the top surface 1a by performing laser processing, and thereby manufactures a plurality of device chips. FIG. 12C is a flowchart of assistance in explaining a flow of steps of the device chip manufacturing method.

Figure 10A:
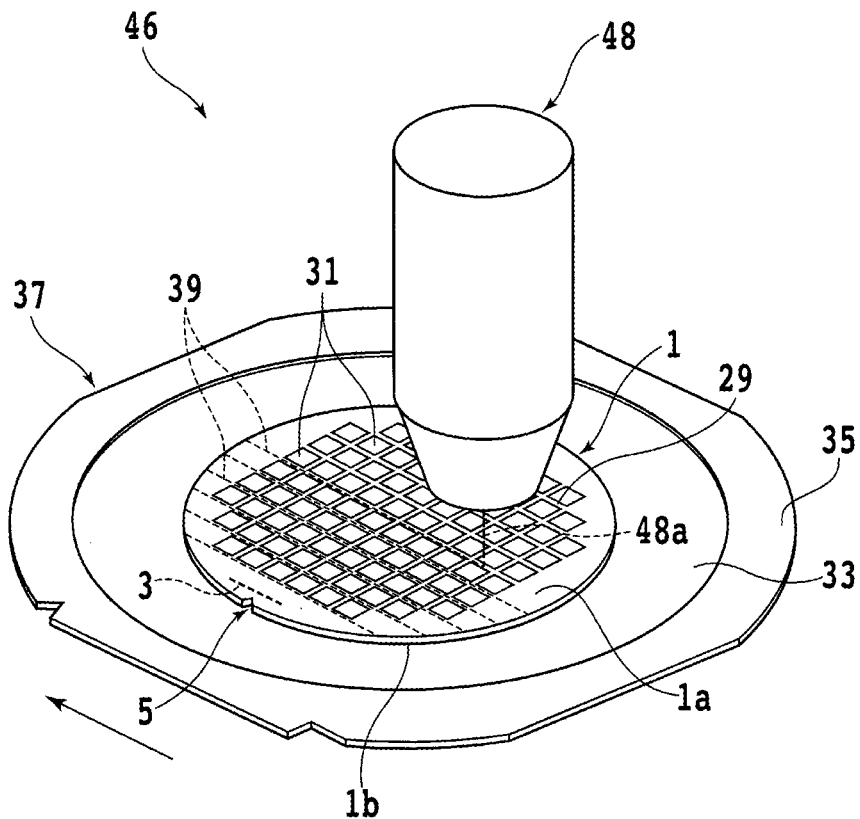
FIG. 10A is a perspective view schematically depicting a laser processing step.

FIG. 10A includes a perspective view schematically depicting the wafer 1 being subjected to laser processing. The wafer 1 will first be described. The device chip manufacturing method, for example, uses the wafer 1 manufactured by the wafer manufacturing method described above. A plurality of planned dividing lines 29 intersecting each other are set on the top surface 1a of the wafer 1. In each of regions demarcated by the planned dividing lines 29 on the top surface 1a of the wafer 1, a process such as photolithography is performed in advance, and a device 31 such as an IC, LSI, or an LED is formed. In addition, the wafer 1 to be subjected to laser processing is integrated in advance with a ring frame 35 formed of a material such as a metal via a tape 33 referred to as a dicing tape, and is handled as a part of a frame unit 37. When the frame unit 37 including the wafer 1 is formed, the handling of the wafer 1 and manufactured device chips is facilitated, and damage to the wafer 1 and the like can be prevented.

A laser processing apparatus 46 depicted in FIG. 10A is used for the laser processing of the wafer 1. The laser processing apparatus 46 is configured in a manner similar to that of the laser processing apparatuses 34 and 40 described above. In FIG. 10A, a chuck table holding the frame unit 37 is omitted. The device chip manufacturing method first performs a loading step S110 of loading the wafer 1 in the state of the frame unit 37 into the laser processing apparatus 46. In the loading step S110, the wafer 1 in the state of the frame unit 37 is mounted on the chuck table (not depicted), and the chuck table sucks and holds the wafer 1 via the tape 33. Then, the wafer 1 is positioned below a laser processing unit 48.

Figure 10B:
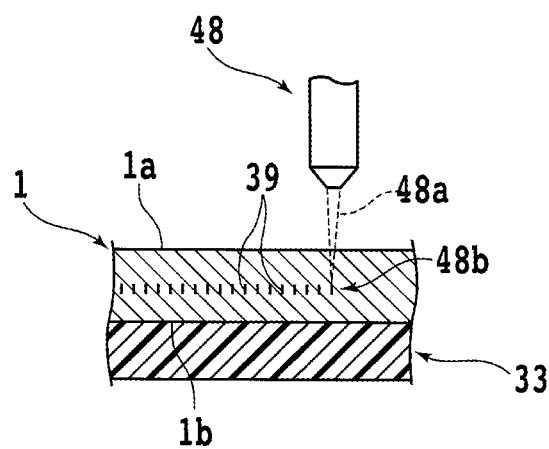
FIG. 10B is a sectional view schematically depicting a wafer being subjected to laser processing.

A laser processing step S120 which subjects the wafer 1 to laser processing by the laser processing unit 48 is performed next. FIG. 10A is a perspective view schematically depicting the laser processing step S120. FIG. 10B is a sectional view schematically depicting the wafer 1 being subjected to the laser processing. In the laser processing step S120, a condensing point 48b of a laser beam 48a having a wavelength passing through the wafer 1 is positioned within the wafer 1, and the laser beam 48a is applied to the condensing point 48b while the condensing point 48b and the wafer 1 are moved relative to each other in a direction parallel with the top surface 1a. A modified layer 39 along a planned dividing line 29 is thereby formed within the wafer 1.

Description will be made in more detail. First, the planned dividing lines 29 of the wafer 1 are aligned with the processing feed direction of the laser processing apparatus 46 by rotating the chuck table. In addition, relative positions of the chuck table and the laser processing unit 48 are adjusted such that the laser processing unit 48 is disposed above an extension of a planned dividing line 29. Then, the condensing point 48b of the laser beam 48a is positioned at a predetermined height position. Next, the chuck table and the laser processing unit 48 are moved relative to each other along the processing feed direction parallel with an upper surface of the chuck table while the inside of the wafer 1 is irradiated with the laser beam 48a from the laser processing unit 48. That is, the condensing point 48b of the laser beam 48a is positioned within the wafer 1, and the wafer 1 is irradiated with the laser beam 48a along the planned dividing line 29. Then, a modified layer 39 is formed within the wafer 1. Incidentally, in FIG. 10A, the modified layer 39 formed within the wafer 1 is indicated by broken lines.

After the modified layer 39 is formed within the wafer 1 along one planned dividing line 29, the chuck table and the laser processing unit 48 are moved relative to each other in an indexing feed direction perpendicular to the processing feed direction, and the wafer 1 is similarly subjected to the laser processing along another planned dividing line 29. After modified layers 39 are formed along all of planned dividing lines 29 along one direction, the chuck table is rotated about an axis perpendicular to the holding surface, and the wafer 1 is similarly subjected to the laser processing along a planned dividing line 29 along another direction.

Here, in the laser processing step S120, the character, the number, or the mark 3 representing the information regarding the resistivity of the wafer 1 is read and irradiation conditions of the laser beam 48a are determined on the basis of the resistivity of the wafer 1. In a case where the wafer 1 is a low resistance SiC wafer, for example, the irradiation conditions of the laser beam 48a in the laser processing step S120 are set as follows, for example.

Wavelength: 1342 nm
Repetition frequency: 90 kHz
Average power: 2.2 W
Processing feed speed: 700 mm/sec In addition, in a case where the wafer 1 is a high resistance SiC wafer, the irradiation conditions of the laser beam 48a in the laser processing step S120 are set as follows, for example.

Wavelength: 1342 nm
Repetition frequency: 90 kHz
Average power: 1.7 W
Processing feed speed: 700 mm/sec Incidentally, in the laser processing step S120, it suffices to irradiate the wafer 1 with the laser beam 48a under the irradiation conditions based on properties of the wafer 1 which properties are assumed from the resistivity of the wafer 1. For example, in a case where a plurality of wafers 1 of a same kind are successively divided by being subjected to the laser processing, it is not necessary to read the character, the number, or the mark 3 from all of the wafers 1 and change the irradiation conditions each time. That is, it suffices to irradiate the wafer with the laser beam 48a under the irradiation conditions determined on the basis of the resistivity of the wafer 1 which resistivity can be obtained from the character, the number, or the mark 3 representing the information regarding the resistivity of the wafer 1. When a plurality of wafers 1 having the same resistivity are subjected to the laser processing, the irradiation conditions at a time of irradiating a certain wafer 1 with the laser beam 48a may be determined on the basis of the resistivity that can be obtained from the character, the number, or the mark 3 formed in or on another wafer 1.

In addition, in a case where the character, the number, or the mark 3 is formed within the wafer 1, it is preferable, for example, to apply light of a wavelength passing through the wafer 1 and image the character, the number, or the mark 3 by a light receiving element that can detect the light. In a case where the wafer 1 transmits infrared rays, for example, infrared rays can be used to image the character, the number, or the mark 3, and the character, the number, or the mark 3 is preferably imaged by using an imaging unit including an infrared light source and an infrared light receiving element.

Figure 11A:
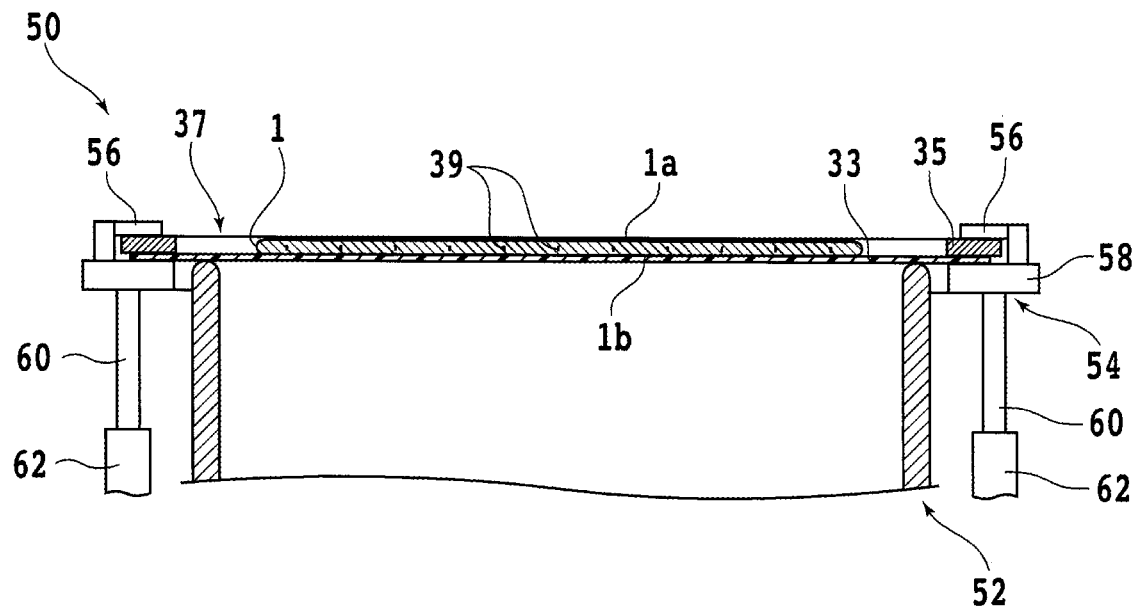
FIG. 11A is a sectional view schematically depicting the wafer loaded into an expanding apparatus.
Figure 11B:
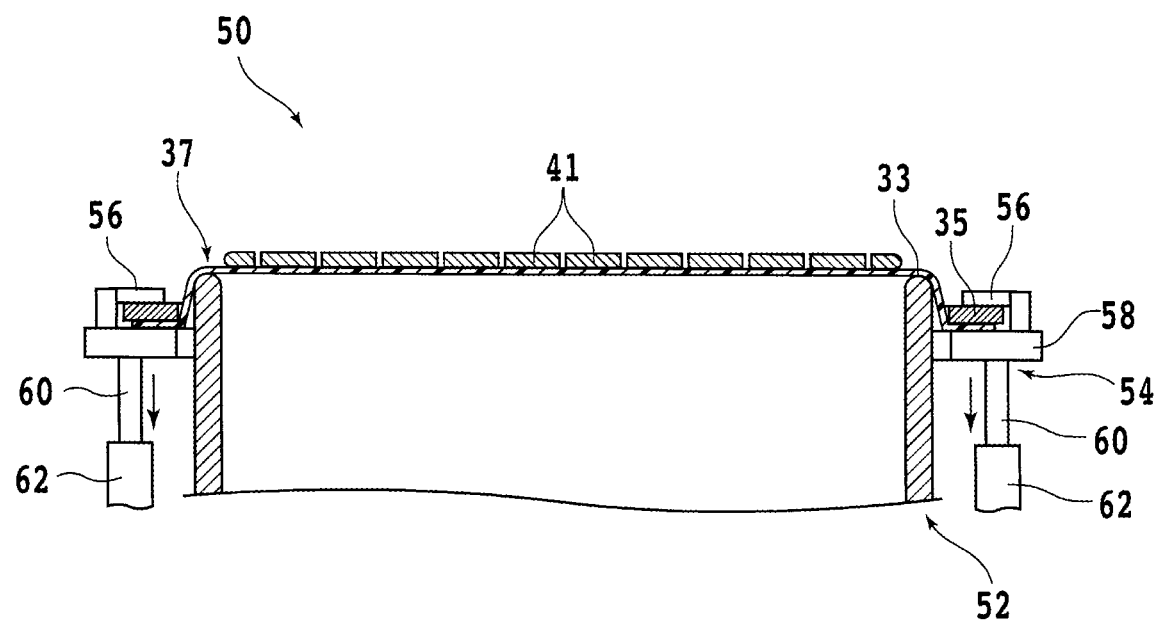
FIG. 11B is a sectional view schematically depicting a dividing step.

After the laser processing step S120 is performed, a dividing step S130 for manufacturing a plurality of device chips by dividing the wafer 1 with the modified layers 39 as a starting point is performed. In the dividing step S130, a force is applied to the wafer 1 by expanding the tape 33 affixed to the wafer 1 outward in a radial direction, and the wafer 1 is thereby divided. An expanding apparatus 50 depicted in FIG. 11A and FIG. 11B is preferably used in the dividing step S130.

The expanding apparatus 50 includes a cylindrical drum 52 having a diameter larger than the diameter of the wafer 1 and a frame holding unit 54 including a frame support 58.

The frame support 58 of the frame holding unit 54 has an opening of a diameter larger than the diameter of the drum 52, is disposed at a height similar to that of an upper end portion of the drum 52, and surrounds the upper end portion of the drum 52 from a peripheral side. Clamps 56 are arranged on the peripheral side of the frame support 58. When the frame unit 37 is mounted on the frame support 58 and the clamps 56 grip the ring frame 35 of the frame unit 37, the frame unit 37 is fixed to the frame support 58. The frame support 58 is supported by a plurality of rods 60 extending along a vertical direction. Air cylinders 62 that raise and lower the rods 60 are arranged at lower end portions of the respective rods 60. When each air cylinder 62 is actuated, the frame support 58 is pulled down with respect to the drum 52.

When the tape 33 is to be expanded, first, the height of the frame support 58 is adjusted by actuating the air cylinders 62 such that the height of an upper end of the drum 52 of the expanding apparatus 50 and the height of an upper surface of the frame support 58 coincide with each other. Next, the frame unit 37 unloaded from the laser processing apparatus 46 is mounted on the drum 52 and the frame support 58 of the expanding apparatus 50. Thereafter, the ring frame 35 of the frame unit 37 is fixed onto the frame support 58 by the clamps 56. FIG. 11A is a sectional view schematically depicting the frame unit 37 fixed onto the frame support 58. The modified layers 39 are formed within the wafer 1 along the planned dividing lines 29.

Next, the frame support 58 of the frame holding unit 54 is pulled down with respect to the drum 52 by actuating the air cylinders 62. Then, as depicted in FIG. 11B, the tape 33 is expanded outward in the radial direction. FIG. 11B is a sectional view schematically depicting the frame unit 37 in a state in which the tape 33 is expanded. When the tape 33 is expanded, a force directed outward in the radial direction acts on the wafer 1, the wafer 1 is divided with the modified layers 39 as a starting point, and individual device chips 41 are formed. When the tape 33 is further expanded, intervals between the device chips 41 supported by the tape 33 are widened, which facilitates picking up of the individual device chips 41.

As illustrated above, in the wafer, the wafer manufacturing method, and the device chip manufacturing method according to the present embodiment, the character, the number, or the mark 3 representing the information regarding the resistivity of the wafer 1 is formed in or on the wafer 1. Therefore, when the modified layers 39 are to be formed within the wafer 1 by subjecting the wafer 1 to laser processing, the irradiation conditions of the laser beam 48a can be determined on the basis of the resistivity of the wafer 1 which resistivity can be obtained from the character, the number, or the mark 3. When the device chips 41 are to be manufactured by subjecting the wafer 1 to laser processing, it is not necessary to measure the resistivity of the wafer 1 which has the devices 31 formed on the top surface 1a and needs to be handled with care. Hence, various wafers 1 can be subjected to laser processing easily and quickly by applying the laser beam 48a under irradiation conditions most suitable for the wafers 1. It is therefore possible to enhance processing efficiency of the wafer 1, and also increase manufacturing efficiency of the device chips 41.

It is to be noted that the present invention is not limited to the description of the foregoing embodiments and can be modified and carried out in various manners. For example, while description has been made of a case where the irradiation conditions under which the wafer 1 is irradiated with the laser beam 48a are adjusted and determined on the basis of the resistivity of the wafer 1 in the foregoing embodiments, one mode of the present invention is not limited to this. That is, the irradiation conditions may be determined in consideration of various elements such as the material and shape of the wafer 1 as well as the condensing depth of the laser beam 48a in addition to the resistivity of the wafer 1.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer wherein a character, a number, or a mark representing information regarding resistivity is formed at a predetermined height position inside the wafer along a curved portion of an outer periphery of the wafer; and
   wherein the character, the number, or the mark representing information regarding resistivity is formed along the entire outer periphery of the wafer.

2. A wafer manufacturing method for manufacturing a wafer from an ingot, the wafer manufacturing method comprising:
   a slicing step of producing a plurality of the wafers by slicing the ingot;
   a resistivity measuring step of measuring resistivity of the wafer;
   an information printing step of forming a character, a number, or a mark representing information regarding the resistivity at a predetermined height position within the wafer after the resistivity measuring step;
   a grinding step of, after the information printing step, grinding the wafer produced in the slicing step, into a predetermined thickness; and
   a polishing step of polishing one or both of a top surface and an undersurface of the wafer ground in the grinding step.

3. The wafer manufacturing method according to claim 2, wherein, in the information printing step, the number representing the resistivity is formed as the information regarding the resistivity.

4. The wafer manufacturing method according to claim 2, wherein, the character, the number, or the mark representing information regarding resistivity is formed along an outer periphery of the wafer.

5. A wafer manufacturing method for manufacturing a wafer from an ingot, the wafer manufacturing method comprising:
   a planarizing step of planarizing an end surface of the ingot;
   a resistivity measuring step of measuring resistivity of the ingot at the planarized end surface;
   a peeling layer forming step of forming a peeling layer within the ingot by positioning a condensing point of a first laser beam having a wavelength transmissible through the ingot at a depth corresponding to a thickness of the wafer to be produced from the end surface, and irradiating the ingot with the first laser beam;
   an information printing step of forming a character, a number, or a mark representing information regarding the resistivity measured in the resistivity measuring step on one or both of the planarized end surface and an inside of the ingot by positioning a condensing point of a second laser beam in a region in which devices are not to be formed in the wafer to be produced, and irradiating the ingot with the second laser beam; and a wafer producing step of producing the wafer by dividing the ingot with the peeling layer as a starting point and peeling off the produced wafer.

6. The wafer manufacturing method according to claim 5, wherein
the ingot is a single crystal SiC ingot having the end surface, an opposite end surface on a side opposite from the end surface, a c-axis extending from the end surface to the opposite end surface, and a c-plane orthogonal to the c-axis,
the c-axis is inclined with respect to a normal to the end surface,
the c-plane is inclined with respect to the end surface at an off angle, and
in the peeling layer forming step, the peeling layer including a modified layer is formed by repeating a processing feed step of forming the modified layer in a linear shape by moving the ingot and the condensing point of the first laser beam relative to each other in a first direction orthogonal to a direction in which the off angle is formed and parallel with the end surface and an indexing feed step of moving the ingot and the condensing point relative to each other in a second direction parallel with the direction in which the off angle is formed and the end surface.

7. A device chip manufacturing method for manufacturing a plurality of device chips by dividing a wafer by laser processing, a plurality of planned dividing lines intersecting each other being set on a top surface of the wafer, a device being formed in each of regions demarcated by the planned dividing lines on the top surface, the device chip manufacturing method comprising:
a loading step of loading the wafer into a laser processing apparatus;
a laser processing step of forming modified layers within the wafer along the planned dividing lines by positioning a condensing point of a laser beam having a wavelength passing through the wafer within the wafer, and applying the laser beam to the condensing point while moving the condensing point and the wafer relative to each other in a direction parallel with the top surface; and
a dividing step of manufacturing a plurality of the device chips by dividing the wafer with the modified layers as a starting point,
wherein a character, a number, or a mark representing information regarding resistivity of the wafer is formed in or on the wafer, and
in the laser processing step, the wafer is irradiated with the laser beam under an irradiation condition determined on a basis of the resistivity of the wafer, the resistivity being able to be obtained from the character, the number, or the mark representing the information regarding the resistivity of the wafer.

* * * * *